US005698371A

United States Patent [19]

Mirle et al.

[11] Patent Number: 5,698,371
[45] Date of Patent: Dec. 16, 1997

[54] PHOTOSENSITIVE POLYMER COMPOSITION FOR FLEXOGRAPHIC PRINTING PLATES PROCESSABLE IN AQUEOUS MEDIA

[75] Inventors: Srinivas K. Mirle, Ellicott City; Truc-Chi T. Huynh-Tran, Burtonsville, both of Md.

[73] Assignee: PT Sub, Inc., Wilmington, Del.

[21] Appl. No.: 242,818

[22] Filed: May 16, 1994

Related U.S. Application Data

[62] Division of Ser. No. 59,928, May 10, 1993, Pat. No. 5,362,605.

[51] Int. Cl.$^6$ ................. G03C 1/73; C08G 18/04; C08G 18/48
[52] U.S. Cl. ............. 430/284.1; 430/906; 522/44; 522/75; 522/97; 522/111
[58] Field of Search .................. 430/284, 906, 430/284.1; 522/44, 75, 97, 111

[56] References Cited

U.S. PATENT DOCUMENTS

| | | | |
|---|---|---|---|
| 3,975,316 | 8/1976 | Villa | 260/2.5 AK |
| 4,387,139 | 6/1983 | Herwig et al. | 430/284 X |
| 4,606,994 | 8/1986 | Illers et al. | 430/284.1 |
| 5,069,999 | 12/1991 | Migashi et al. | 430/284.1 |
| 5,122,443 | 6/1992 | Takeda | 430/281 X |
| 5,236,967 | 8/1993 | Ohkawa et al. | 522/32 |
| 5,317,080 | 5/1994 | Arimatsu et al. | 430/283 X |
| 5,341,799 | 8/1994 | Fifield et al. | 430/284 X |
| 5,364,741 | 11/1994 | Huynh-Tran et al. | 430/284 X |
| 5,547,712 | 8/1996 | Huynh-Tran et al. | 430/284.1 X |

OTHER PUBLICATIONS

US Application Ser. No. 08/246,197.

*Primary Examiner*—George F. Lesmes
*Assistant Examiner*—Bernard P. Codd
*Attorney, Agent, or Firm*—Woodcock Washburn Kurtz Mackiewwicz & Norris LLP

[57] ABSTRACT

A photocurable composition useful in preparing water-developable, solid printing plates is prepared by blending a urethane (meth)acrylate prepolymer with a complexing polymer based on poly(vinyl pyrrolidone) composition. The resulting composition is suitably formulated with additional photoactive (meth)acrylate monomers or oligomers and photoinitiator for casting or extrusion on a substrate to form a flexographic printing plate. Following UV exposure of the plate through a negative, unexposed areas can be removed by washing with aqueous media, to give a plate with a desirable relief image. The use of the aqueous washout solution as opposed to organic solvents minimizes pollution problems. The use of the complexing polymer significantly reduces the cold flow of the uncured plate and both increases toughness and reduces tack of the cured plate.

15 Claims, No Drawings

PHOTOSENSITIVE POLYMER COMPOSITION FOR FLEXOGRAPHIC PRINTING PLATES PROCESSABLE IN AQUEOUS MEDIA

This is a division of application Ser. No. 08/059,928, filed May 10, 1993 now U.S. Pat. No. 5,362,605.

FIELD OF THE INVENTION

This invention relates to radiation curable formulations or compositions, as well as photosensitive articles having solid surfaces or layers prepared from such polymers or formulations. Specifically, solid composition can be obtained by blending a liquid or semi-solid photosensitive polymer having polar functionalities with a complexing polymer. This blend is easily dispersible in aqueous media, yields an uncured material with good dimensional stability and a cured material which is tough, yet relatively soft, and can be used to make a printing plate.

BACKGROUND OF THE INVENTION

Photocurable polymers and compositions are well known in the art for forming printing plates and other photosensitive or radiation sensitive articles. In the field of radiation sensitive flexographic printing plates, the plates typically comprise a support and a photosensitive surface or layer from a photocurable composition. Additional layers or surfaces on the plate include slip and release films to protect the photosensitive surface. Prior to processing the plate, the additional layers are removed, and the photosensitive surface is exposed to radiation in an imagewise fashion. The unexposed areas of the surface are then removed in developer baths.

Removal of unexposed surfaces comprising solid photocurable compositions such as those disclosed in U.S. Pat. No. 2,760,863 require the use of developer baths comprising environmentally unsafe, organic solvents such as tetrachloroethylene, 2-butanone, benzene, toluene, xylene, trichloroethane and solvent mixtures such as tetrachloroethylene/n-butanol. However, due to the toxicity, high volatility and low flash point, their use gives rise to hazardous conditions and creates pollution problems. Thus, recently there has been a strong interest in the field to develop photosensitive layers in non-organic solvent developing solutions, e.g., aqueous, surfactant-aqueous or alkaline-aqueous solutions. However, the compositions resulting from recent attempts to achieve aqueous developable plates demonstrate deficiencies in mechanical properties, e.g., flexibility. See European Application 261, 910.

For instance, in addition to possessing an aqueous developable photosensitive surface, a flexographic printing plate must have sufficient flexibility to wrap around a printing cylinder, yet be strong enough to withstand the rigors experienced during typical printing processes. Further, the printing plate should be soft enough to facilitate ink transfer during printing.

Previous aqueous developable compositions have not possessed all the desirable features such as flexibility, softness and solvent resistance to inks typically used in printing. For example, U.S. Pat. No. 4,023,973 describes a photosensitive composition comprising a maleic anhydride adduct of a 1,2-polybutadiene. However, because the 1,2 content of this material is very high, i.e., 70% or more, this composition has an undesirably high rubber hardness.

Furthermore, other water-developable photosensitive compositions which contain as the main component a high molecular weight polymer such as polyvinyl alcohol, cellulose, polyethylene oxide, or the like, are insufficient in flexibility and possess a high degree of rubber hardness and hence are unsuitable for use in flexographic printing plates.

Finally, it is also important that the photosensitive surface of the printing plate be dimensionally stable during storage. For example, some compositions used for making plates have shown inferior stability properties when used in solid flexographic printing plates in that the compositions become tacky and pasty during storage. Those inferior properties have been attributed to the low molecular weight of the polymers used to prepare the printing plates. See U.S. Pat. No. 4,762,892 to Koch et al. and discussion of low molecular weight polymers disclosed in Japanese Kokoku 57-23693.

Photosensitive formulations using the polymers of this invention are water-developable without presenting any of the aforesaid disadvantages.

Certain polyurethane (meth)acrylate photo-sensitive polymers useful in an embodiment of the present invention are disclosed in copending United States Application Ser. Nos. 924,264, filed Mar. 8, 1992 now U.S. Pat. No. 5,328, 805 and 003,167, filed Dec. 1, 1993, now U.S. Pat. No. 5,364,741 both of which are incorporated herein by reference as if set forth in full.

Toray Industries has two U.S. Pat. Nos. (4,889,793 and 4,927,739) and an EP Application (452,656) relate to water-developable flexographic printing plates that use "gelling agents" in photosensitive compositions but do not specifically mention poly(vinyl pyrrolidone) polymers or copolymers, and they contain only qualitative information with respect to physical properties.

P. Molyneux, "Water Soluble Polymers: Properties and Behavior", vol. II, pg. 171, CRC Press (1984) discusses the solubility in water of hydrogen-bonding complexes.

SUMMARY OF THE INVENTION

In an embodiment of the present invention, a polyether diol (polyoxyalkylene diol) optionally with a polyester diol is end-capped with an excess of a diisocyanate, the resulting isocyanate capped polyurethane is chain-extended with an alkyl-dialkanolamine, and the chain-extended polymer is reacted with hydroxyalkyl(meth)acrylate to terminate the polymer chains with (meth)acrylates. One of ordinary skill in the art will recognize that, in addition to the polyether diols and the polyester diols discussed above, various blends of diols may be utilized. The above-described photopolymers have polar functionalities which can hydrogen bond with complexing polymers, such as the polymers and copolymers of poly(vinyl pyrrolidone) ("PVP"). When the liquid or semi-solid photosensitive polymers are blended with complexing polymers, a solid with improved cold flow, that is, better dimensional stability is obtained. The final polymer product is photosensitive (photocurable) and can be formulated with photosensitizer and (meth)acrylate diluents to make water-developable printing plates, photoresists, and the like.

Key features of the invention include (inter alia):
(1) The final product is a solid. This means here is no cold flow in the formulated printing plates, which remain dimensionally and thermally stable.
(2) The photopolymer synthesis optionally uses an alkyl dialkanolamine, thereby integrating an amine into the polymer chain, resulting in water dispersibility.
(3) The photopolymer has terminal (meth)acrylate groups for UV curability.

(4) The blend of the photopolymer and the complexing polymer is dispersible in water.

(5) The cured photopolymer composition also has increased tensile strength and elongation, which gives a very tough flexographic printing plate.

OBJECTS OF THE INVENTION

It is an object of the invention to prepare a novel, solid water-dispersible polymer of predetermined sequentially designed structure which can be crosslinked or cured by exposure to actinic radiation.

A further object is to make a water-developable storage-stable flexographic relief printing plate.

A still further object is to make a printing plate that can be developed in aqueous solutions that are harmless to the environment.

It is an object of the invention to provide a photosensitive article comprising a novel photocurable composition.

Another object is to provide an uncured flexographic printing plate with improved dimensional stability.

Unless otherwise indicated the term "(meth)acrylate" means either acrylate or methacrylate.

Molecular weights are number average, $M_n$, as determined by Gel Permeation Chromatography using polystyrene standards.

DETAILED DESCRIPTION

Complexing Polymers

It has been found that the addition of a complexing polymer or copolymer to the formulation of a urethane (meth)acrylate photopolymer results in a solid composition that is water dispersible. Preferred complexing polymers are the polymers and copolymers of PVP. Such materials are commercially available as PVP polymers having molecular weights of 5,000 to 100,000. Polymers having molecular weights of about 10,000, 24,000 and 40,000 are commercially available from Aldrich Chemical Company, Milwaukee, Wis. PVP-vinyl acetate copolymers are available as Luviskol™ polymers from BASF Corp., Parsippany, N.J. Of those, the copolymers having up to 40% vinyl acetate are preferred. When the complexing polymer is used, the uncured plate has improved cold flow. A further advantage is that surface tack, which can occur with certain unblended photosensitive polymers, is reduced.

Urethanes

The photosensitive polymers having polar functionality of one embodiment of the invention are polyurethane (meth) acrylates. Such materials can be prepared as described below. The main reactions and products involved in the invention are given schematically and simplistically as follows:

1. P+Cy→(Cy-P)$_x$-Cy (I);
2. N+Cy→(Cy-N)$_y$-Cy (II);
3. I+N+II→[(Cy-P)$_x$-(Cy-N)$_y$]$_z$-Cy (Prepolymer III, or III): this reaction is optional; (Note: Reactions 2. and 3. go forward together.)
4. III+A→A-[(Cy-P)$_x$-(Cy-N)$_y$]$_z$-Cy-A (Photopolymer IV, or IV, where P is a polyether diol or polyester diol or their moieties, Cy is a diisocyanate or its moiety, N is an alkyldialkanolamine or its moiety, and A is a hydroxyalkyl(meth)acrylate or its moiety. In these reactions hydroxyl containing compounds are linked to diisocyanate containing compounds via urethane linkages, —NH—C(:O)—O—, to form the respective moieties. x, y, and z may differ from molecule to molecule, but are such that the over-all molecular weight of Prepolymer III, whether made from polyether diol or polyester diol or their mixtures, as in the range of about 5,000–60,000 (preferably about 5,000–30,000), and that of Photopolymer IV is in the range of about 5,000–60,000 (preferably about 7,000–40,000). Segments of I and II may be positioned randomly in the chain.

The aforesaid 4 reactions may be restated explicitly. In this restatement the mole ratio of P:Cy:N:A must be 1:1.3–8:0.2–7:0.1–3, preferably 1.5–6:0.4–5:0.2–1.

Depending on the molecular weight of the polyols (in this case polyether, polyester, polycaprolactone or polycarbonate polyols or mixtures of polyols), it is preferable to select the molar ratio of the reactants P (for polyols), Cy (for diisocyanate), N (for alkyldi-alkanolamine) and A for hydroxyalkyl(meth)acrylate such that: (weight percent as cited below is based on the total weight of the final photopolymer):

(a) the total polyol content is preferably between 60 and 80 weight percent in order for the final photopolymer to have good flexibility or elastomeric properties and (b) in one embodiment, the alkyldialkanolamine content is preferably 1–10 weight percent in order to maintain good water developability, however use of alkyldialkanolamine is not required in all embodiments, and (c) the hydroxyalkyl(meth)acrylate content is preferably 0.8–2 weight percent so that good photocurability and hence good resistance to ink swell can be achieved.

1. Reaction of polyether or polyester diol (P) with the aforestated stoichiometric excess of diisocyanate (Cy):
   (i) In the case of polyether diol:

(I-i)

HO—(—A—O—)$_b$H+excess OCNR$^1$NCO→OCN—B—R$^1$—NCO where

A is —CH$_2$CH$_2$—, —CH$_2$CH$_2$CH$_2$—, —CH$_2$CH(CH$_3$)—, —CH$_2$CH$_2$CH$_2$CH$_2$—, —CH$_2$CH$_2$CH(CH$_3$)—, or —CH$_2$CH(CH$_3$)CH$_2$— or mixtures thereof;

B represents one or more segments of [—R$^1$—NH—C(:O)O(—A—O—)$_b$C(:O)NH—]

b is determined by the molecular weight of the polyether diol and is discussed in the description of polyether diol, below.

R$^1$ is a divalent aromatic, aliphatic, or cycloaliphatic group containing 2–20 carbons, preferably 5–15.

(ii) In the case of polyester diol:

HO—D—R$^2$OH+excess OCNR$^1$NCO→OCN—R$^1$—E—NCO (I-ii)

where

D represents repeating segments of [—R$_2$—O—C(:O)—[(R$^3$)$_{0\ or\ 1}$]—C(:O)O—], E represents one or more segments of [—NHC(O)—O—D—R$^2$O—C(:O)—NH—R$^1$—]

R$^2$ is a divalent aliphatic, cycloaliphatic, or alpharyl group of 2–20 carbons;

R$^3$, when present (i.e., when R$^3$ is 1), is a divalent aliphatic, cycloaliphatic, aryl or alpharyl group of 1–22 carbons.

When mixtures of polyether diols and polyester diols are used, the diols can be used in any ratio.

These end-capping reactions are well known. As indicated, the terminal isocyanates on initially formed end-capped diols may react with other hydroxyl groups on other polyether or polyester diols, thereby increasing over-all molecular weight of the resulting polyurethane. This reaction is suitably carried out at conventional temperatures, e.g., within the range of about 25°–80° C.

Optional chain extension of prepolymer product (I-i and/or I-ii) with alkyldialkanolamine (HO—$R^4$—$R^5$—$R^6$—OH). In this operation, Reactions 2 and 3 go forward together, the product II of Reaction 2 serving as an intermediate in Reaction 3:

2. OCN—$R^1$—OCN+HO—$R^4$—$R^5$—$R^6$—OH→OCN—F—$R^1$—NCO (II)

where

F represents one or more segments of [—$R^1$—NH—C(:O)—O—$R^4$—$R^5$—$R^6$—O—C(:O)NH—]

$R^4$ and $R^6$ are the same or different alkylene groups with 1–6 carbons; or $R^4$ can be —$(CH_2CH_2O)_d CH_2CH_2$— provided $R^6$ is —$(CH_2CH_2O)_e CH_2CH_2$—, where d and e are each 0–9 and d+e=3–15;

$R^5$ is —N($R^7$)—, —N N—, or —N(Ph)—; Ph=phenyl)

$R^7$ is an alkyl group with 1–6 carbons.

3. I+HO—$R^4$—$R^5$—$R^6$—OH+II→OCN—R—$R^1$—NCO (Prepolymer III, or III), where R comprises one or more segments of B and/or one or more segments of E; and one or more segments of F; which is to say, R comprises B, E, and F; or R consists essentially of B and F; or R consists essentially of B and E.

Reactions 2 and 3 are carried out in the same reaction mixture substantially simultaneously, at a temperature in the range of about 25°–60° C., until all of the hydroxyl groups have reacted as determined by titration of the remaining isocyanate. As indicated, individual polymer chains in III may be expected to vary in the number of polyether diol, polyester diol, diisocyanate, and alkyldialkanolamine moieties. The reactant proportions are controlled within the ranges stated above so that all or substantially all polymer chains will terminate in isocyanate. This condition is essential for the fourth (and final) step. A small amount of residual free diisocyanate may be left after the formation of III.

In Reactions 2 and 3, note that the molar ratio, Cy/(P+N), is always >1.

Within IIIa preferred structure results when $R^1$ is 4,4'-methylene diphenylene (MDI)

$R^4$ and $R^6$ are ethylene;

$R^5$ is —N($R^7$)—;

$R^7$ is methyl;

the diols include a mixture of an ethylene oxide end-capped polyoxypropylene diol and a polypropylene adipate diol where (—A—O—)$_b$ has a molecular weight of about 1000–3500.

Prepolymer III and the herein described processes for synthesizing it are considered novel.

Reaction 4. Reaction of chain-extended polymer (Prepolymer III) with hydroxyalkyl (meth) acrylate to give Photopolymer IV:

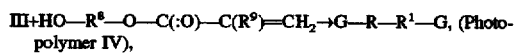

where

G is $CH_2$=C($R^9$)—C(:O)—O—$R^8$—O—C(:O)—NH—, $R^8$ is 1–7 carbon alkylene, and $R^9$ is H or methyl.

Within IV a preferred structure results when $R^1$ is 4,4'-methylene diphenylene $R^4$, $R^6$, and $R^8$ are ethylene;

$R^7$ and $R^9$ are methyl;

$R^5$ is —N($R^7$)—;

the diols include a mixture of an ethylene oxide end-capped polyoxypropylene diol and a polypropylene adipate diol where; (—A—O—)$_b$ has a molecular weight of about 1000–500.

The relationship of III and IV is readily evident in the structure J—R—$R^1$—J' where the J's are identical and are either —NCO (giving III), or G (giving IV).

This Reaction 4 is suitably carried out at a temperature in the range of about 60°–80° C., and is conveniently carried out following chain extension Reactions 2 and 3, in the same vessel. Consistent with III, Segments B and/or E, and F may be positioned at random in the polymer chains of IV. As indicated, most of the molecules comprise multiple moieties of polyether (and/or polyester) diol, end-capping diisocyanate, and chain-extending dialkanolamine, with all or substantially all polymer molecules of IV being terminated with alkylene(meth)acrylate.

The reactions described above can be carried out without a solvent, but preferably are carried out in an anhydrous organic solvent. Suitable solvents include methyl ethyl ketone, methyl isobutyl ketone, toluene, and mixtures thereof. The solvents should have a boiling point in the range of 80°–120° C. for easy casting of films and evaporation of solvent.

The following is a further description of the reactants.

The Diol (a) Polyether Diol

This product has the structure HO—(A—O)$_b$H where A is a divalent radical of ethylene, propylene, isopropylene, butylene, isobutylene; and b is such that the number average molecular weight of the group [A—O]$_b$, or of the polymer diol (which is substantially the same thing) is within the range of about 650–7,000, preferably about 1,000–3,500. Polypropylene oxide glycol, MW about 1,000–3,500, or polypropylene oxide end-capped with ethylene oxide, where the amount of ethylene oxide is 1–50 weight percent, preferably 10–30 weight percent, of the overall molecular weight, MW about 1,000 to 7,000, preferably 1,000–4,000, are especially preferred. In the instance where copolymers are used, the idealized structure for A(O)$_b$ would be —$(CH_2CH_2O)_x$—$(CH_2CH(CH_3)$—O)$_y$—$(CH_2CH_2O)_z$— where x+z and y are such that the ethylene oxide moiety represents about 1–50, preferably 10–30, weight percent of the overall polyol molecular weight. Such copolymers include POLY G55-37 (MW 2952, containing about 30 weight percent of ethylene oxide), and POLY L 225-28 (MW 4000, containing about 20 weight percent ethylene oxide); both available from Olin Corp. The polyether diol reactants may be made by processes well known in the art by reacting an alkylene oxide or mixtures of alkylene oxides with a compound having at least one active hydrogen atom, such as water; monohydroxylic alcohols such as ethanol and propanol; and dihydroxylic alcohols such as ethylene glycol and monoethyl ether of glycerine. The poly(oxyalkylene) products of such reactions will have linear oxyalkylene or oxyethylene-higher oxyalkylene chains, and such chains will terminate with hydroxyl groups. Conventional potassium hydroxide catalysts or double metal cyanide catalysts can be used.

(b) Polyester Diol.

As noted, the polyester diol, HO—D—$R^2$OH, where D and $R^2$ have the values above given, may be used alone or in admixture with polyether diols. Suitable polyester diols include those made from dibasic acids or caprolactones with an excess of glycol. The dibasic acids, which are preferred, are those of the structure HO—C(:O)—[(R³)₀ ₒᵣ ₁]—C(:O) OH, with an excess of glycol of the structure HO—R²—OH where R² and R³ are as above defined.

The molecular weight of D (or of the polyester diol, which is substantially the same thing) should be about 600–6,000, preferably about 1,000–3,500.

Suitable dibasic acids include those of the saturated series, i.e., oxalic, malonic, succinic, glutaric, adipic, pimelic, suberic, and the like. In this group, adipic acid is preferred. Aromatic dibasic acids include phthalic and terephthalic acids. In lieu of the acid itself, the anhydride may be used, e.g., phthalic anhydride, or its ester may be used, e.g., methyl terephthalate. Acid mixtures may be used. When R³ is zero the acid is of course oxalic. When R³ is "1," R³ contains 1–20 carbons and the subsequent dibasic acid contains 3–22 carbons.

Suitable glycols for making the polyester diol include the alkylene glycols, e.g., ethylene glycol, propylene glycol, trimethylene glycol, the three butane diols, tetramethylene glycol, isobutylene glycol, pinacol, and the like, including their mixtures. The diol may have a cycloalkane structure or alkyl aromatic structure.

Useful polyester diols made from adipic acid include poly(diethylene adipate) diol, poly(ethylene adipate) diol, poly(propylene adipate) diol having a molecular weight of about 1000 to 5000, e.g., about 2400, poly(propylene/ ethylene) adipate diol, poly(butylene adipate) diol, poly (ethylene/butylene adipate) diol, poly(neopentyl adipate) diol, poly(hexane/neopentyl) adipate diol, poly(hexane adipate) diol, polycaprolactone diols and the like or mixtures thereof.

Processes for making polyester diols are well known. See, for example, *Encyclopedia of Polymer Science and Engineering*, John Wiley & Sons (1988), 2d Ed., Vol. 12, pp. 28–42, especially pp. 33–34; and Vol. 13, pp. 259–261.

The Diisocyanate

A wide variety of diisocyanates is available for end-capping the polyether diol. These diisocyanates can be aliphatic, cycloaliphatic, or aromatic, with the structure OCN—R¹NCO. The divalent radical R¹ contains in general 2 to 100 carbon atoms and may optionally carry non-interfering substituents such as ether groups, ester groups, urethane groups, amido groups, urea groups, aryl groups, aliphatic groups, cycloaliphatic groups, or halogen atoms. Modified diisocyanates are also usable. In one preferred embodiment, glycol modified diphenylmethane diisocyanate are particularly effective. Examples of suitable diisocyanates include 4,4'-methylene diphenyl diisocyanate (MDI), modified MDI, such as MDI reacted with a polyether polyol, available as Isonate 2181 from Dow Chemical Co., and MDI prepolymers, 2,4-tolylene diisocyanate (toluene diisocyanate), 2,6-tolylene diisocyanate, mixtures of the two latter isomers, dimer of 2,4-tolylene diisocyanate, p-xylene diisocyanate, m-xylene diisocyanate, 1,5-naphthalene diisocyanate, 3,3'-dimethylbiphenyl-,4,4'-diisocyanate, hexamethylene diisocyanate, trimethylhexamethylene diisocyanate, lysine diisocyanate, isophorone diisocyanate, 4,4'-methylenebis(cyclohexylisocyanate), methylcyclohexane-2,4 (or 2,6)-diisocyanate, 1,3-(isocyanatomethyl)cyclohexane, m-tetramethylxylene diisocyanate, p-tetramethylxylene diisocyanate, and mixtures thereof.

Conventional urethane-forming catalysts may be used in the reactions with diisocyanates. These catalysts include, e.g., organo-tin compounds such as dibutyl tin dilaurate and stannous octoate, organo-mercury compounds, tertiary amines, and mixtures of these materials.

Alkyldialkanolamine

This material has the structure HOR⁴R⁵R⁶OH, where the numbered R's are as above defined. Within this group, methyldiethanolamine, bis(hydroxyethyl)-piperazine, OHC₂H₄—N N—C₂H₄OH, and N,N'-Bis(2-hydroxypropyl) aniline, HO—CH(CH₃)CH₂—N(Ph)—CH₂CH(CH₃)OH are preferred. (Ph–phenyl.)

Hydroxyalkyl(meth)acrylate

This material has the structure HO—R⁸OC(:O)—C(R⁹) =CH₂, where the R's are as above defined. Within this structure hydroxyethylmethacrylate is preferred.

Formulations with the Invention Photopolymer

The simplest formulation is the photopolymer and complexing polymer, plus an effective amount of photoinitiator. Such mixture can be solvent cast, as is, or the solvent removed and the mixture extruded to create a solid photopolymerizable layer on conventional backing materials. However, for many commercial uses it will be found preferable to formulate or extend the photopolymerizable composition with about 1 to 30% by weight of reactive (i.e., photoactive) monomer or oligomer, and most preferably in the range of 5 to 15% by weight reactive monomer. Suitable reactive monomers or oligomers are those of the formula:

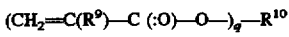

$(CH_2=C(R^9)-C(:O)-O-)_q-R^{10}$ where R⁹ is H or methyl, R¹⁰ is an organic moiety having a valence of q, and q is an integer.

Such reactive (meth)acrylate diluents include, but are not limited to, trimethylolpropane triacrylate, hexanediol diacrylate, 1,3-butylene glycol diacrylate, diethylene glycol diacrylate, 1,6-hexanediol diacrylate, neopentyl glycol diacrylate, polyethylene glycol 200 diacrylate, tetraethylene glycol diacrylate, triethylene glycol diacrylate, pentaerythritol tetraacrylate, tripropylene glycol diacrylate, ethoxylated bisphenol-A diacrylate, propylene glycol mono/ dimethacrylate, trimethylolpropane diacrylate, di-trimethylolpropane tetraacrylate, triacrylate of tris (hydroxyethyl) isocyanurate, dipentaerythritol hydroxypentaacrylate, pentaerythritol triacrylate, ethoxylated trimethylolpropane triacrylate, triethylene glycol dimethacrylate, ethylene glycol dimethacrylate, tetraethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimethylolpropane trimethacrylate, diethylene glycol dimethacrylate, 1,4-butanediol diacrylate, diethylene glycol dimethacrylate, pentaerythritol tetramethacrylate, glycerin dimethacrylate, trimethylolpropane dimethacrylate, pentaerythritol trimethacrylate, pentaerythritol dimethacrylate, pentaerythritol diacrylate, urethane-methacrylate or acrylate oligomers and the like which can be added to the photopolymerizable composition to modify the cured product. Monoacrylates such as cyclohexyl acrylate, isobornyl acrylate, lauryl acrylate and tetrahydrofurfuryl acrylate and the corresponding methacrylates are also operable as reactive diluents, as well as methacrylate oligomers such as epoxy acrylates, urethane acrylates, and polyester or polyether acrylates.

Photoinitiators

The formulations comprising the novel materials of this invention require a photoinitiator. A large number are available and useful.

Photoinitiators for the photopolymerizable composition and formulations containing the same include the benzoin alkyl ethers, such as benzoin methyl ether, benzoin ethyl ether, benzoin isopropyl ether and benzoin isobutyl ether.

Another class of photoinitiators are the dialkoxyacetophenones exemplified by 2,2-dimethoxy-2-phenylacetophenone, i.e., Irgacure®651 (Ciba-Geigy) and 2,2-diethoxy-2-phenylacetophenone. Still another class of photoinitiators are the aldehyde and ketone carbonyl compounds having at least one aromatic nucleus attached directly to the carboxyl group. These photoinitiators include, but are not limited to benzophenone, acetophenone, o-methoxybenzophenone, acetonaphthalenequinone, methyl ethyl ketone, valerophenone, hexanophenone, alpha-phenylbutyrophenone, p-morpholinopropiophenone, dibenzosuberone, 4-morpholinobenzophenone, 4'-morpholinodeoxybenzoin, p-diacetylbenzene, 4-aminobenzophenone, 4'-methoxyacetophenone, benzaldehyde, alpha-tetralone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracen-7-one, 1-naphthaldehyde, 4,4'-bis(dimethylamino)-benzophenone, fluorene-9-one, 1'-acetonaphthone, 2'-acetonaphthone, 2,3-butedione, acetonaphthene, benz[a]anthracene 7.12 diene, etc. Phosphines such as triphenylphosphine and tri-o-tolylphosphine are also operable herein as photoinitiators. The photoinitiators or mixtures thereof are usually added in an amount ranging from 0.01 to 5% by weight of the total composition.

Other Additives

The compositions may also contain other additives, which are known in the art for use in photocurable compositions, e.g., antioxidants, antiozonants, plasticizers and UV absorbers. To inhibit premature crosslinking during storage of the prepolymer containing compositions of this invention, thermal polymerization inhibitors and stabilizers are added. Such stabilizers are well known in the art, and include, but are not limited to, hydroquinone monobenzyl ether, methyl hydroquinone, amyl quinone, amyloxyhydroquinone, n-butylphenol, phenol, hydroquinone monopropyl ether, phenothiazine, phosphites, nitrobenzene and phenolic-thio compounds, and mixtures thereof. Such additives are used in an amount within the range of from about 0.01 to about 4% by weight of the prepolymer. These stabilizers are effective in preventing crosslinking of the prepolymer composition during preparation, processing and storage.

UV light absorbers, or UV light stabilizers, can be used to adjust the photospeed and, therefore, exposure latitude of the polymer material. Numerous materials will be apparent to those skilled in the art.

The most important light stabilizer classes are: 2-hydroxy-benzophenones, 2-hydroxyphenyl benzotriazoles, hindered amines and organic nickel compounds. In addition, salicylates, cinnamate derivatives, resorcinol monobenzoates, oxanilides, and p-hydroxy benzoates are used as well. These additives are used in the range of about 0.09 to about 4% by weight of the prepolymer.

Tinuvin® 1130, a substituted hydroxyphenyl benzotriazole, available from Ciba-Geigy Corp., has been found to work exceptionally well.

The compositions also may contain up to about 50% by weight of an inert particulate filler which is essentially transparent to actinic light. Such fillers include the organophilic silicas, bentonites, silica and powdered glass. Such fillers can impart desirable properties to the photocurable compositions and reliefs on printing plates containing those compositions.

The compositions may also contain dye and/or pigment coloring agents. The colorants present in the photopolymer composition must not interfere with the imagewise exposure and should not absorb actinic radiation in the region of the spectrum that the initiator, present in the composition is activatable.

The colorant may be chosen from among the numerous commercially available pigments and dyes. The coloring agent may be used in a solvent soluble form, or in the form of a dispersion. Where a particulate material is used, the particle size should be less than 5000 Angstroms. More preferably, the particles will be in the 200–3000 Angstrom range.

Although numerous pigments and dyes useful in the practice of the present invention will be apparent to those skilled in the art, a small number of such materials are listed here.

Suitable pigments include the Microlith® series available from Ciba-Geigy. Especially preferred are the A3R-K and 4G-K materials. Suitable dyes include for example, Baso Blue 645 (C.I. Solvent Blue 4), Baso Blue 688 (C.I. Solvent Blue 81), Luxol Fast Blue MBSN (C.I. Solvent Blue 38), Neopen Blue 808 (C.I. Solvent Blue 70), Orasol™ Blue 2GLN (C.I. Solvent Blue 48), Savinyle Blue GLS (C.I. Solvent Blue 44), Savinyl Blue RLS (C.I. Solvent Blue 45), Thermoplast Blue 684 (C.I. Solvent Violet 13) and Victoria Blue BO (C.I. Solvent Blue 7). Blue and violet are used in current applications but the color of the dye is not critical. Other colors could offer advantages, including for example, resistance to fading.

The composition may also contain a plasticizer. Examples of plasticizers include: benzoates, phthalates, phosphates and sulfonamides. Dipropylene glycol dibenzoate is the preferred plasticizer.

Formulations using the photopolymers of this invention include the following (in parts by weight):

(1) Photopolymer, a polyurethane (meth)acrylate) about 50–100, preferably about 70–90;

(2) A mono-, di-, or multi-acrylate diluent, which can be a monomer or oligomer, about 0–25, preferably about 5–15;

(3) Photoinitiator, about 0.1–10, preferably about 0.5–2.0;

(4) Organic solvent, 0 to about 200, preferably about 10–50.

(5) stabilizers, UV absorbers and colorants, 0.1 to 10, preferably about 1–4, total.

(6) Polyvinyl pyrrolidone) or copolymer of PVP with up to 40% vinyl acetate, about 0.1 to 50, preferably about 4 to 20.

(7) A plasticizer compatible with both the photopolymer and PVP such as dipropylene glycol dibenzoate, about 1–20, preferably about 2–10.

Preparation of Plate

The photocurable composition can then be shaped and formed as a solid layer of suitable thickness according to conventional solvent casting, i.e., dissolving the composition in a solvent, shaping the solution into a film or plate and removing the solvent. Conventional extrusion, calendaring or hot press techniques can also be used. Solid layers of the photosensitive composition in the form of a film can be adhered to supports such as those comprising polyester, nylon or polycarbonate. Other suitable supports include woven fabrics and mats., e.g., glass fiber fabrics or laminated materials made of, for example, glass fibers and plastics, and steel or aluminum coated plates. It is preferred that the supports are dimensionally stable and resistant to the washout solutions.

It is also usually necessary to protect photosensitive surfaces from contamination by dirt and dust during storage before being exposed and washed. Such protection is accomplished by lamination of application of a flexible protective cover sheet to the side of the photocurable composition opposite that of the support. In addition, the photocurable compositions can sometimes be tacky and it is thus also desirable to apply a release film to the surface of the photosensitive layer before application of the coversheet. The release film consists of a thin, flexible and water soluble polymeric film and allows for intimate contact between the surface of the photocurable composition opposite to the support and an image-bearing negative applied to the surface.

Exposure and Development

Photosensitive articles comprising a support having a solid layer or surface comprising the photocurable composition, e.g., solid flexographic printing plates, can then be processed by well-known techniques for imagewise exposure to actinic light. Preferably, the light should have a wavelength of from about 230–450 microns. Exposure is through a negative placed between the light source and the photosensitive surface. Suitable sources of light include Type RS sunlamps, carbon arc lamps, xenon arc lamps, mercury vapor lamps, tungsten halide lamps and the like.

Exposure periods depend upon the intensity of the actinic light, thickness of the plate and the depth of the relief desired on the printing plate. Periods of from 1 to 20 minute exposures are preferred.

Development After exposure and removal of the negative, the unexposed areas of the photosensitive surface can be developed (removed) in aqueous washout solutions as herein described. This feature is particularly advantageous in that it avoids problems of disposing of washout solutions containing commonly used organic solvents, such as chlorinated solvents, alcohols, or ketones. The washout solution should be slightly acidic and may contain a surfactant. Dilute vinegar or citric acid solutions are preferred. Useful acidic surfactants include sodium alkylnaphthalene-sulfonate, sodium alkylbenzene sulfonate, sodium alkyl ether sulfate, polyoxyalkylated alkylaryl phosphate ester sodium salt and the like. Overall additive concentrations are suitably 0.1–5%. Wash temperature can vary from 25°–70° C. preferably at ambient temperature. Following washout, the plate may be post-exposed for further hardening of the relief work.

EXAMPLES

The following examples illustrate without limiting the invention.

The raw materials used in the examples are described below:

| Item | Description |
| --- | --- |
| TDI | Toluene (or tolylene) diisocyanate, 2,4 and 2,6-80/20 isomer mixture from Aldrich Chemical Co., Inc. |
| Isonate 2181 | Modified 4,4'-methylene diphenyl diisocyanate from Dow Chemical Co., % NCO = 23. |
| PPG 1025 | Polypropylene oxide diol from Arco Chemical Co.; MW = 1000. |
| Poly G 55-112 | Polypropylene oxide/ethylene oxide diol from Olin Corp., MW = 1000. |
| Poly G 55-37 | ethylene oxide end-capped polyoxypropylene diol, hydroxyl number = 37, MW = 3000 from Olin Chemical Co. |
| POLY L 225-28 | ethylene oxide end-capped polyoxypropylene diol, hydroxyl number = 28, MW = 4000, from Olin Corp. |
| S-108-46 | Rucoflex S-108-46 is polypropylene adipate diol from Ruco Polymer Corporation, MW = 2400. |
| PVP | poly(vinyl pyrrolidone) of MW 10,000 from Aldrich Chemical Co. |
| Luviskol | PVP-vinyl acetate copolymers from BASF Corp. |
| Irganox 1520 | 2,4-bis[(octylthio)methyl]-o-cresol used as stabilizer, from Ciba-Geigy Corp. |
| Irgacure 651 | 2,2-dimethoxy-2-phenylacetophenone, from Ciba-Geigy Corp. |
| Sartomer 9035 | ethoxylated trimethylolpropane trimethacrylate from Sartomer Co. |
| Benzoflex 9-88 | dipropylene glycol dibenzoate from Velsicol Chemical Corp., Chicago, IL |

Example 1

10 parts of poly(Vinyl pyrrolidone) of MW 10,000 from Aldrich Chemical Co. were dissolved in 10 parts of methyl ethyl ketone and 10 parts of ethanol by standing overnight in a 60° C. oven. To this solution, 50 parts of a liquid methacrylated polyurethane (viscosity about 30,000 cps) (based on polyols such as Rucoflex S-108-46 and Poly G 55-37 from Ruco Polymers and Olin Chemicals, respectively, tolylene diisocyanate and hydroxypropyl methacrylate) were added and mixed with low shear for one hour. Also mixed in were 0.5 parts of 2,2-dimethoxy-2-phenyl-acetophenone (photoinitiator). The complexed polymer solution was deaerated and solvent-cast into a waxy material that did not flow. These solid films were exposed through an image to UV light and then developed in 0.4% citric acid at room temperature with a wash rate in excess of 5 mils/min. The cured film had a Shore A hardness of 39.

Example 2

15 parts of Luviskol (PVP-vinyl acetate copolymer from BASF Corp.) were dissolved in 15 parts of ethanol by standing overnight in a 60° C. oven. The copolymer solution was mixed with 50 parts of the methacrylated polyurethane described in Example 1 and with 0.5 parts of 2,2-dimethoxy-2-phenylacetophenone. The complexed polymer solution was deaerated and solvent-cast into a waxy material that did not flow. When processed further as in Example 1, the imaged film washed in a 1% aqueous acetic acid solution at room temperature with a rate in excess of 3.5 mils/min. The cured film had a Shore A hardness of 47.

Example 3

A. Synthesis of Polyurethane-methacrylate (Polymer Solution A)

A two-liter resin kettle equipped with an air powered stirrer, a nitrogen purge and a thermowatch was charged with 100 grams (0.266 moles) of Isonate 2181, 196.3 grams (0.066 moles) of POLY G 55-37 and 54.1 grams (0.022 moles) of Rucoflex S-108-46. The mixture was heated to 60° C. for about 2 hours under vigorous stirring and then the reaction was allowed to react for another 16 hours at 35° C. The reaction mixture was then heated to 60° C. for another 4 hours until an isocyanate end point of about 1 milliequivalent per gram was reached (as determined by standard titration with dibutylamine). Then 382 grams of toluene and 85 grams of methyl ethyl ketone were added to the reaction vessel followed by the addition of 18.5 grams (0.155 moles) of methyldiethanolamine. The temperature of the reaction was then raised to 35° C. The reaction was allowed to proceed for another 3-4 hours until the titration indicated that 0.05 milliequivalents of isocyanate groups per gram of solution remained. 5.8 grams (0.044 moles) of hydroxyethylmethacrylate and 7.5 grams of Irganox 1520 were then added. The reaction mixture was allowed to stir for another 16 hours after which there was no detectable isocyanate groups on the IR spectrum. The resulting polymer solution (designated as Polymer A) was a transparent, slightly yellow, viscous mixture.

B. Formulation of Polymer Solution A with Poly (vinyl pyrrolidone)

Polymer Solution A was then mixed with a poly(vinyl pyrrolidone) solution (prepared by dissolving 10 parts of PVP in 50 parts isopropanol) using an air powered stirrer and the formulations are described in Table 1. The formulations were cast into films to evaporate the solvents and the properties were determined.

Melt flow was determined by a CS-127 Melt Indexer from Custom Scientific Instruments, Cedar Knolls, N.J. The melt flow was the amount of polymer extruded at 75° C. with a 10 kg. weight and calculated on a basis of 10 minutes. The values reported are an average of three runs.

catalysts to obtain low unsaturation and low monoalcohol content, as described in "Thermoplastic Polyurethane Elastomers Made From High Molecular Weight POLY-L Polyols" by C. P. Smith et al., J. Elastomers and Plastics, Vol. 24, p. 306, October 1992). While purging with nitrogen, the mixture was heated to 70° C. for about 6 hours under vigorous stirring. Heat was then turned off and the reaction was then allowed to proceed for another 16 hours at ambient temperature. The reaction was titrated and an isocyanate end point of 0.84 milliequivalents per gram was reached. 145 grams of toluene and 32 grams of methyl ethyl ketone were added, while mixing. A solution containing 14.8 grams (0.1241 moles) of methyldiethanolamine chain extender, 145 grams of toluene and 32 grams of methyl ethyl ketone was added. The reaction mixture was stirred vigorously while the temperature was maintained below 40° C. The reaction was allowed to proceed for another 6 hours after which a significant increase in the viscosity can be observed and an isocyanate content of 0.05 milliquivalents per gram of solution was left (as determined by titration). A solution containing 72 grams of toluene, 16 grams of methyl ethyl ketone and 7.2 grams of Irganox 1520 was added, while stirring, followed by 4.6 grams (0.035 moles) of hydroxyethylmethacrylate. The reaction was allowed to proceed until the complete disappearance of the isocyanate peak at 2260 $cm^{-1}$ on the IR spectrum. The resultant product was a transparent, viscous liquid (designated as Solution B).

B. Formulation of Polymer Solution B with Poly (Vinyl Pyrrolidone)

Polymer Solution B was then mixed with a poly(vinyl pyrrolidone) solution (prepared by dissolving 10 parts of

TABLE 1

|  | Formulation A | Formulation B | Formulation C |
|---|---|---|---|
| Poly(vinyl pyrrolidone) solution (10 parts PVP in 50 parts Isopropanol) | 0 part | 17 parts | 26.5 parts |
| Parts of PVP based on Total solids content | 0 part | 2.5 parts | 4 parts |
| POLYMER SOLUTION A (prepared as described above) | 250 parts | 250 parts | 250 parts |
| Hexanediol dimethacrylate<br>Lauryl methacrylate<br>Irgacure 651 | 2.2 parts<br>2.2 parts<br>1.1 parts | 2.2 parts<br>2.2 parts<br>1.1 parts | 2.2 parts<br>2.2 parts<br>1.1 parts |
| Melt Flow (grams/10 min) | 11 | 2.2 | 0.35 |
| Elongation (%)[1]<br>Tensile strength (psi)<br>Modulus (psi)<br>Shore A<br>Resilience | 745<br>360<br>185<br>34<br>25 | 875<br>855<br>240<br>45<br>25 | 930<br>1365<br>290<br>52<br>23 |
| Washout rate in 0.25% formic acid at room temperature[2] | 1.7 | 1.7 | D |

[1] Properties measured from 20 mil dry films, exposed for 10 minutes
[2] Washout determined using an A&V brush type of lab washout unit Example 4

A. Synthesis of Polyurethane-Methacrylate (Polymer Solution B)

A two-liter resin kettle was charged with: 80 grams (0.213 moles) of Isonate 2181, 110 grams (0.0354 moles) of POLY G 55-37, and 145.2 grams (0.0354 moles) of Poly L 255-28 (from Olin Chemicals, prepared using double metal cyanide PVP in 50 parts isopropanol) using an air powered stirrer and the formulations are described in Table 2. The formulations were cast into films to evaporate the solvents and the properties were determined.

TABLE 2

|  | Formulation A | Formulation B |
|---|---|---|
| Poly(vinyl pyrrolidone) solution (10 parts PVP in 50 parts Isopropanol) | 0 part | 16.3 parts |
| Parts of PVP based on Total solids content | 0 part | 4 parts |
| POLYMER SOLUTION B (prepared as described above) | 150 parts | 150 parts |
| Hexanediol dimethacrylate | 1.3 parts | 1.3 parts |
| Lauryl methacrylate | 1.3 parts | 1.3 parts |
| Irgacure 651 | 0.7 parts | 0.7 parts |
| Dipropylene glycol dibenzoate | 0 part | 3.4 parts |
| Melt Flow (grams/10 min) | 9.9 | 1.1 |
| Elongation (%)[1] | 650 | 875 |
| Tensile strength (psi) | 375 | 900 |
| Modulus (psi) | 175 | 200 |
| Shore A | 40 | 45 |
| Resilience | 39 | 44 |

[1]Properties measured from 20 mil dry films, exposed for 10 minutes
[2]Washout determined using an A&V brush type of lab washout unit

What is claimed:

1. An aqueous-developable, solid photocurable composition suitable for use in a flexographic printing plate, the photocurable composition comprising:

(a) a liquid or semi-solid photocurable polymer, 50 to 100 parts by weight;

(b) a complexing polymer selected from the group consisting of poly(vinyl pyrrolidone) and poly(vinyl pyrrolidone)/vinyl acetate copolymers having up to 40% vinyl acetate, 4 to 20 parts by weight; and (c) optionally a plasticizer, 2 to 20 parts by weight; in which the photocurable polymer is the reaction product of (i) a 4,4'-methylene diphenyl diisocyanate;

(ii) an ethylene oxide capped polypropylene oxide diol having a molecular weight of about 1000 to 7000;

(iii) optionally, a poly(propylene adipate) diol having a molecular weight of about 1000 to 5000;

(iv) an alkyldialkanolamine chain-extending agent; and (v) a hydroxyalkyl (meth)acrylate terminating agent in an amount sufficient to react with all remaining isocyanate groups;

the mole ratio of the components being 1 mole of (ii)+(iii) to 1.3 to 8 moles of (i) to 0.2 to 7 moles of (iv) to 0.1 to 3 moles of (v);

all molecular weights being number average molecular weights.

2. A composition of claim 1 in which the 4,4'-methylene diphenyl diisocyanate is modified by reaction with a polyether polyol, and the chain extending agent is methyldiethanolamine.

3. A composition of claim 2 further comprising (d) a photoinitiator.

4. A composition of claim 3 in which the photoinitiator is 2,2-dimethoxy-2-phenylacetophenone.

5. A composition of claim 2 further comprising (e) one or more reactive diluents.

6. A composition of claim 5 in which the reactive diluent (e) is selected from the group consisting of propylene glycol monomethacrylate, diethylene glycol dimethacrylate, hexanediol dimethacrylate, lauryl methacrylate, ethoxylated trimethlylolpropane trimethacrylate, aromatic acrylated urethane oligomer, and $C_{14}$–$C_{15}$ methacrylate monomer mixture, and mixtures thereof.

7. A composition of claim 2 further comprising (f) a UV absorber.

8. A composition of claim 7 in which the UV absorber is a hydroxyphenylbenzotriazole.

9. A composition of claim 2 further comprising (g) a pigment having a particle size less than 5000 angstroms.

10. A composition of claim 2 in which a plasticizer is used.

11. A composition of claim 10 in which the plasticizer is dipropylene glycol dibenzoate.

12. A composition of claim 2 in which the liquid or semi-solid polymer is prepared by the steps comprising:

(I) reacting together in a solvent for the reactants, in the mole ratios stated, the modified 4,4'-methylene diphenyl diisocyanate, 12 moles;

ethylene oxide capped polypropylene oxide diol having a molecular weight of about 3,000, 3 moles;

poly(propylene adipate) diol having a molecular weight of about 2400, 1 mole; thereby end-capping the diols with isocyanate;

(II) adding to the reaction mixture of (I), methyl diethanolamine, 7 moles; continuing the reaction to chain extend the isocyanate-capped diols, thereby providing chain-extended isocyanate-capped diols terminated in isocyanate groups;

(III) adding to the reaction mixture of (II), hydroxyethylmethacrylate, 2 moles, and continuing the reaction to react the terminal isocyanate groups of (II) with the hydroxyl groups of the hydroxyethylmethacrylate.

13. A composition of claim 2 in which the liquid or semi-solid polymer is prepared by the steps comprising:

(I) reacting together in a solvent for the reactants, in the mole ratios stated, the modified 4,4'-methylene diphenyl diisocyanate, 12 moles;

ethylene oxide capped polypropylene oxide diol having a molecular weight of about 3,000, 2 moles;

ethylene oxide capped polypropylene oxide diol having a molecular weight of about 4,000, 2 moles;

(II) adding to the reaction mixture of (I), methyl diethanolamine, 7 moles; continuing the reaction to chain extend the isocyanate-capped diols, thereby providing chain-extended isocyanate-capped diols terminated in isocyanate groups;

(III) adding to the reaction mixture of (II), hydroxyethylmethacrylate, 2 moles, and continuing the reaction to react the terminal isocyanate groups of (II) with the hydroxyl groups of the hydroxyethylmethacrylate.

14. A composition of claim 2 in which the liquid or semi-solid polymer is prepared by the steps comprising:

(I) reacting together in a solvent for the reactants, in the mole ratios stated, the modified 4,4'-methylene diphenyl diisocyanate, 12 moles;

ethylene oxide capped polypropylene oxide diol having a molecular weight of about 3,000, 1 moles;

ethylene oxide capped polypropylene oxide diol having a molecular weight of about 4,000, 3 moles;

(II) then adding to the reaction mixture of (I), methyl diethanolamine, 7 moles; continuing the reaction to chain extend the isocyanate-capped diols, thereby providing chain-extended isocyanate-capped diols terminated in isocyanate groups;

(III) adding to the reaction mixture of (II), hydroxyethylmethacrylate, 2 moles, and continuing the reaction to react the terminal isocyanate groups of (II) with the hydroxyl groups of the hydroxyethylmethacrylate.

15. A composition of claim 2 in which the liquid or semi-solid polymer is prepared by the steps comprising:

(I) reacting together in a solvent for the reactants, in the mole ratios stated, the modified 4,4'-methylene diphenyl diisocyanate, 12 moles;

ethylene oxide capped polypropylene oxide diol having a molecular weight of about 4,000, 4 moles;

(II) then adding to the reaction mixture of (I), methyl diethanolamine, 7 moles; continuing the reaction to chain extend the isocyanate-capped diols, thereby providing chain-extended isocyanate-capped diols terminated in isocyanate groups;

(III) adding to the reaction mixture of (II), hydroxyethylmethacrylate, 2 moles, and continuing the reaction to react the terminal isocyanate groups of (II) with the hydroxyl groups of the hydroxyethylmethacrylate.

* * * * *